(12) United States Patent
Kang et al.

(10) Patent No.: US 11,276,563 B2
(45) Date of Patent: Mar. 15, 2022

(54) PLASMA ETCHING METHOD USING FARADAY BOX

(71) Applicant: LG CHEM, LTD., Seoul (KR)

(72) Inventors: Soo Hee Kang, Daejeon (KR); Song Ho Jang, Daejeon (KR); Geun Sik Jo, Daejeon (KR); Chung Wan Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 16/982,191

(22) PCT Filed: Jun. 18, 2019

(86) PCT No.: PCT/KR2019/007321
§ 371 (c)(1),
(2) Date: Sep. 18, 2020

(87) PCT Pub. No.: WO2020/004854
PCT Pub. Date: Jan. 2, 2020

(65) Prior Publication Data
US 2021/0027996 A1    Jan. 28, 2021

(30) Foreign Application Priority Data

Jun. 29, 2018 (KR) .......................... 10-2018-0075361

(51) Int. Cl.
*H01L 21/3065* (2006.01)
*H01L 21/67* (2006.01)
*H01J 37/32* (2006.01)
*B29C 33/38* (2006.01)
(Continued)

(52) U.S. Cl.
CPC .... *H01J 37/32651* (2013.01); *B29C 33/3842* (2013.01); *H01J 37/321* (2013.01); *H01J 37/3244* (2013.01); *H01L 21/3065* (2013.01); *H01L 21/67069* (2013.01); *B29L 2031/757* (2013.01); *G02B 5/1852* (2013.01); *H01J 2237/334* (2013.01)

(58) Field of Classification Search
None
See application file for complete search history.

(56) References Cited

U.S. PATENT DOCUMENTS 4,309,267 A * 1/1982 Boyd .................... H01J 37/34
204/192.32
5,662,999 A * 9/1997 Taniguchi .............. C03B 11/08
428/216

(Continued)

FOREIGN PATENT DOCUMENTS

EP    3712927 A1    9/2020
EP    3730271 A1    10/2020
(Continued)

OTHER PUBLICATIONS

Surface Resistivity and Surface Resistance Measurements Using a Concentric Ring Probe Technique. William A. Maryniak et al.; Advanced Energy Application Note. (Year: 2020).*

*Primary Examiner* — Allan W. Olsen
(74) *Attorney, Agent, or Firm* — Dentons US LLP

(57) ABSTRACT

A plasma etching method using a Faraday cage which is capable of inhibiting the formation of a needle-like structure and forming a pattern portion having a depth gradient on an etching base.

13 Claims, 6 Drawing Sheets

(51) Int. Cl.
*B29L 31/00* (2006.01)
*G02B 5/18* (2006.01)

(56) References Cited

U.S. PATENT DOCUMENTS

| | | | | |
|---|---|---|---|---|
| 7,879,201 | B2* | 2/2011 | Druz | C23C 14/044 |
| | | | | 204/192.11 |
| 8,999,105 | B2* | 4/2015 | Loncar | H01L 21/3065 |
| | | | | 156/345.48 |
| 9,659,797 | B1* | 5/2017 | Burckel | H01J 37/32651 |
| 2010/0167186 | A1 | 7/2010 | Jang et al. | |
| 2014/0123895 | A1* | 5/2014 | Kato | H01J 37/32651 |
| | | | | 118/697 |
| 2015/0368093 | A1* | 12/2015 | Cho | H01J 37/32623 |
| | | | | 216/11 |
| 2016/0035539 | A1 | 2/2016 | Sainiemi et al. | |
| 2016/0211156 | A1 | 7/2016 | Singh et al. | |
| 2017/0031171 | A1 | 2/2017 | Vallius et al. | |
| 2020/0335347 | A1* | 10/2020 | Her | B29D 11/00 |
| 2020/0365379 | A1* | 11/2020 | Her | H01J 37/32357 |

FOREIGN PATENT DOCUMENTS

| | | |
|---|---|---|
| JP | 1993343366 A | 12/1993 |
| JP | 1997213686 A | 8/1997 |
| JP | 2002313732 A | 10/2002 |
| JP | 2010-141338 A | 6/2010 |
| JP | 2014-58151 A | 4/2014 |
| JP | 2014-093226 A | 5/2014 |
| JP | 2015-019065 A | 1/2015 |
| JP | 6115300 B2 | 4/2017 |
| KR | 10-20000033006 A | 6/2000 |
| KR | 10-0281241 B1 | 6/2001 |
| KR | 10-0451291 B1 | 1/2005 |
| KR | 10-20050102484 A | 10/2005 |
| KR | 10-20080055294 A | 6/2008 |
| KR | 10-1690828 B1 | 5/2014 |
| KR | 10-1576205 B1 | 12/2015 |
| KR | 10-20180120450 A | 11/2018 |

* cited by examiner

[Figure 1]
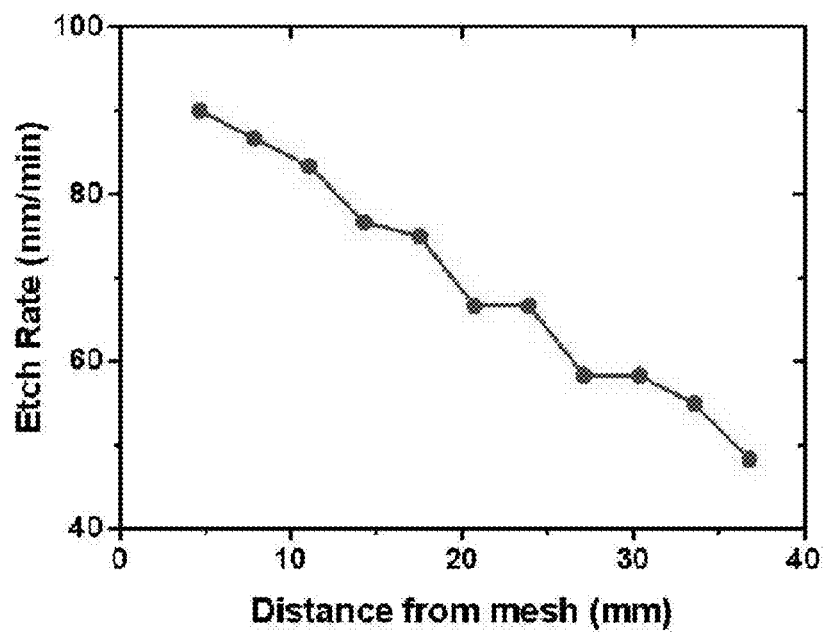

[Figure 2]
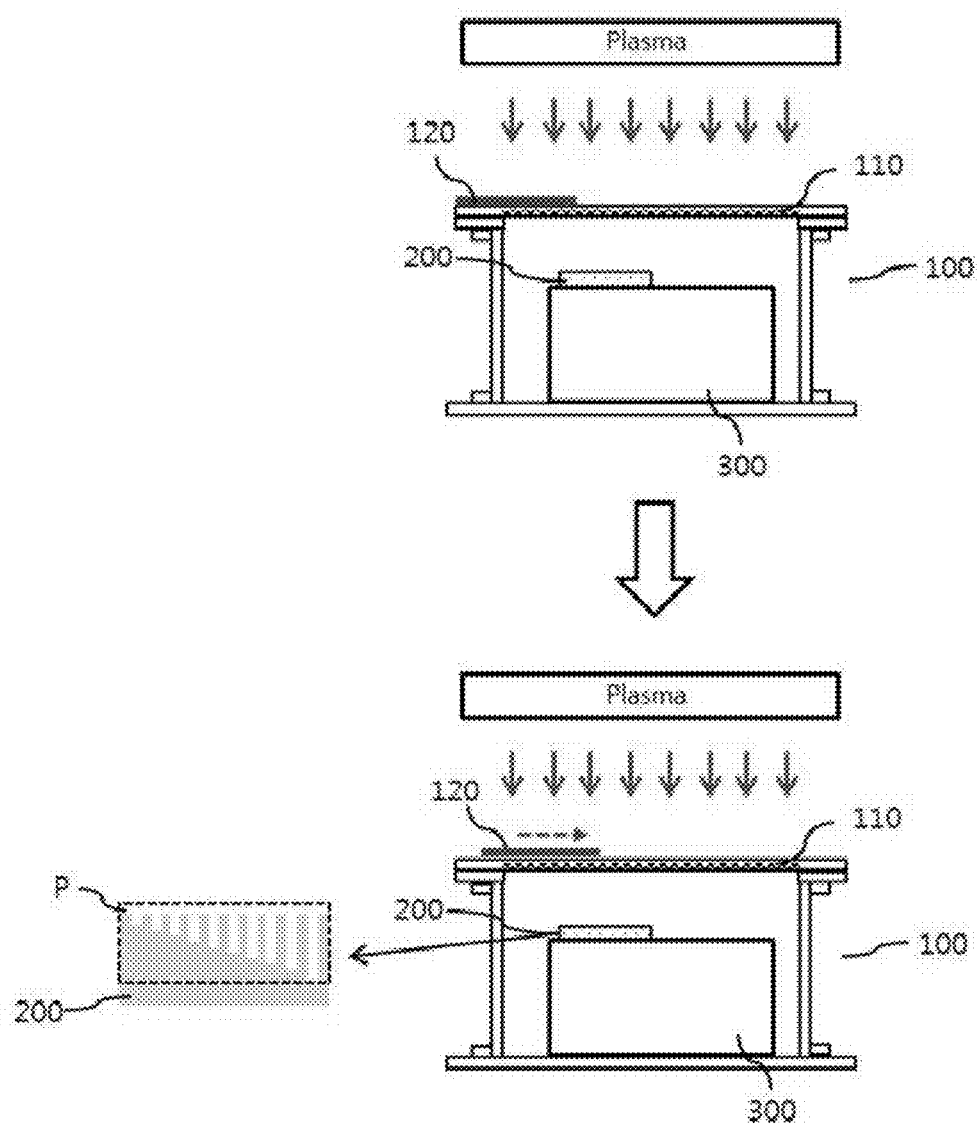

[Figure 3]
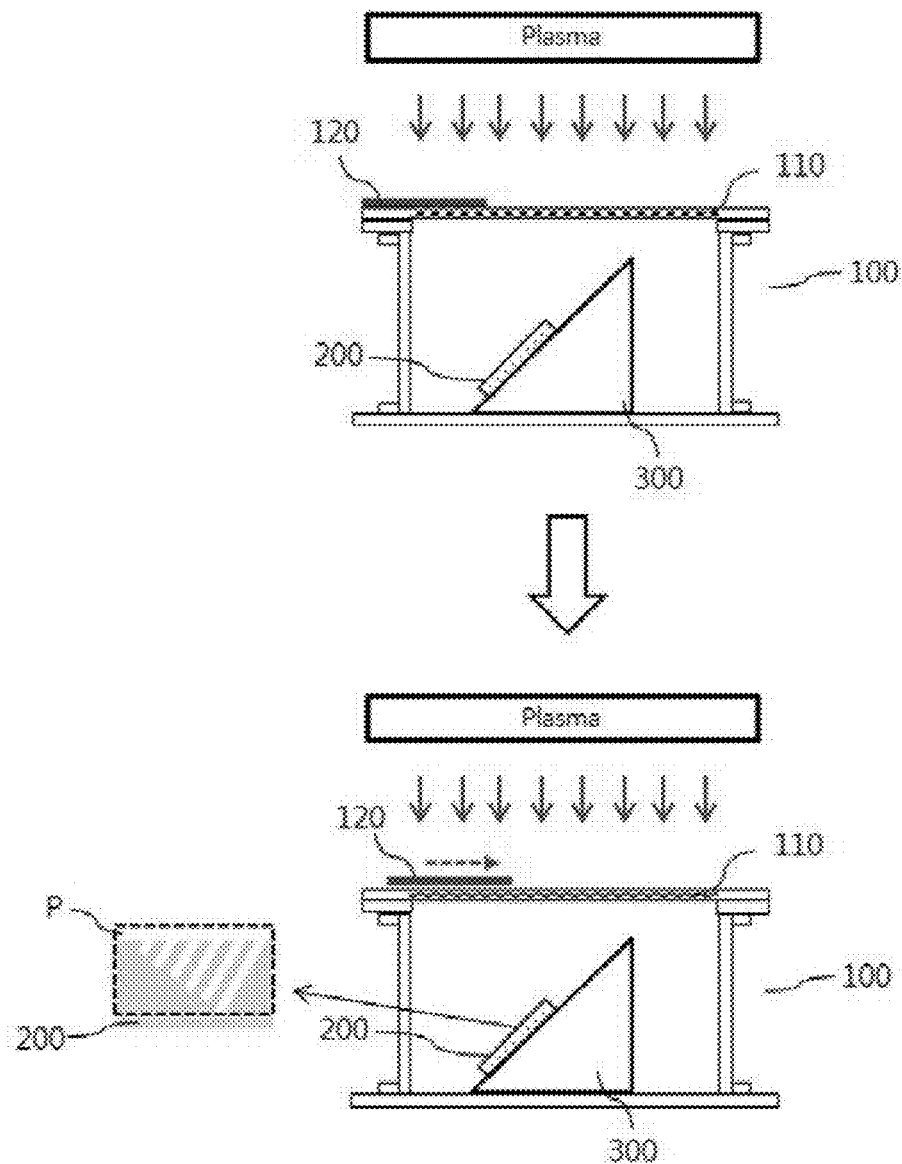

[Figure 4A]
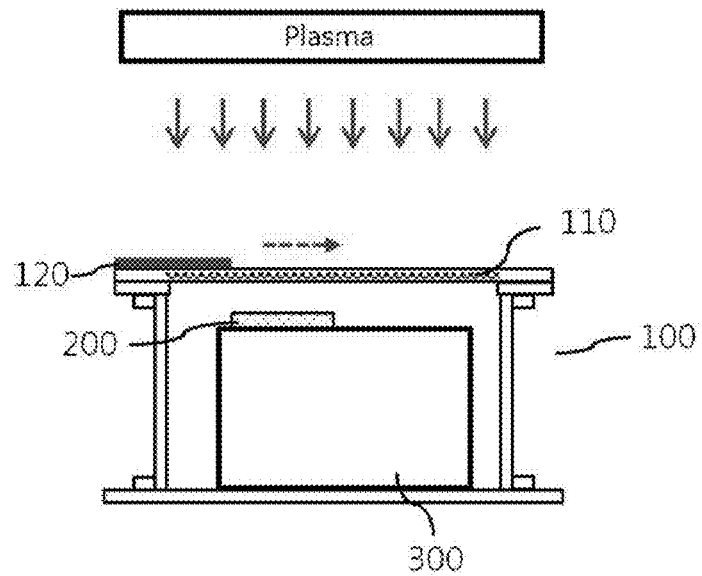
[Figure 4B]
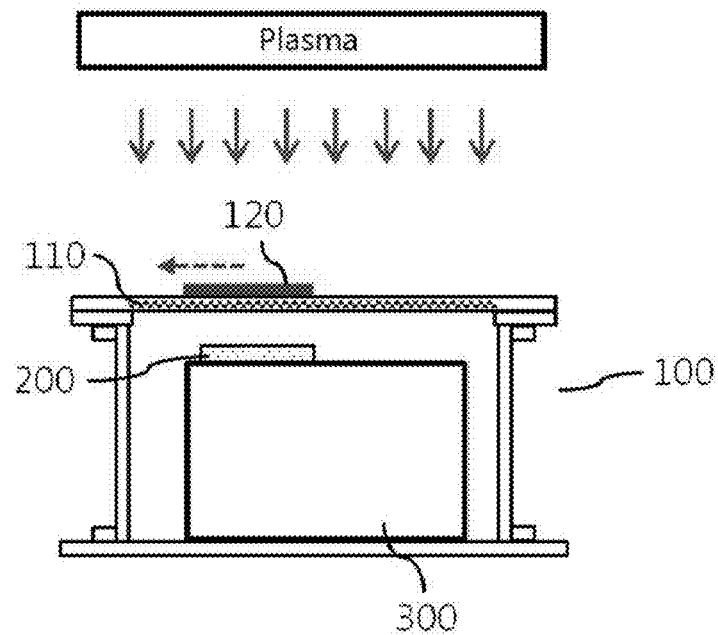

[Figure 5A]
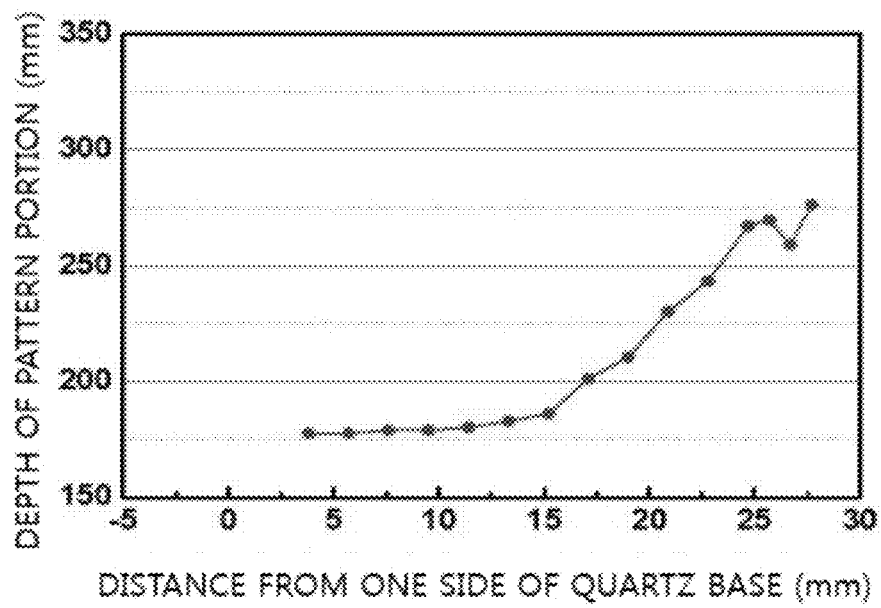
[Figure 5B]
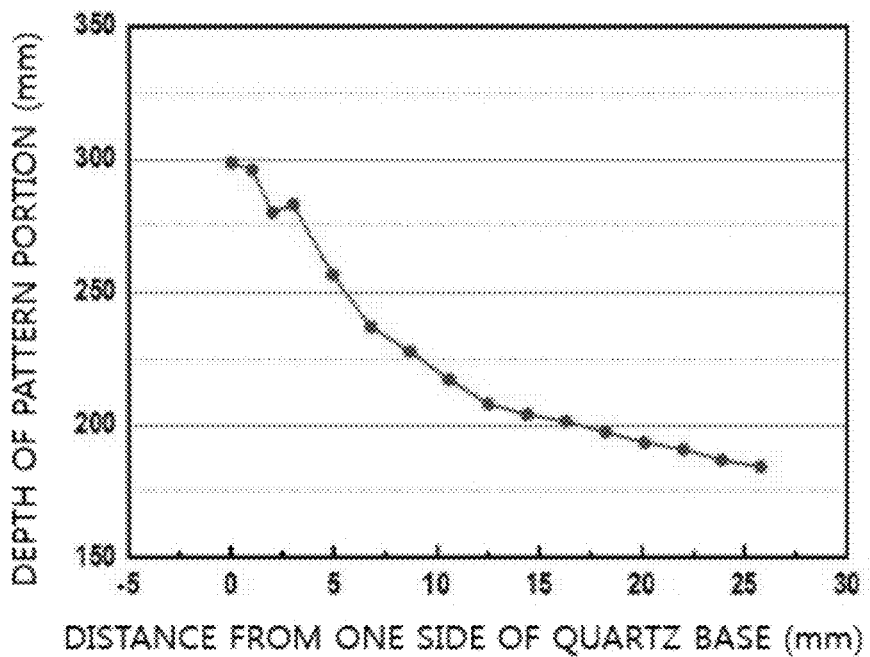

[Figure 6A]

| DISTANCE FROM ONE SIDE OF QUARTZ BASE (mm) | 3 | 8.7 | 23.9 |
|---|---|---|---|
|  |  |  |  |

[Figure 6B]

| DISTANCE FROM ONE SIDE OF QUARTZ BASE (mm) | 3 | 8.7 | 25.8 |
|---|---|---|---|
|  |  |  |  |

PLASMA ETCHING METHOD USING FARADAY BOX

CROSS-REFERENCE TO RELATED APPLICATIONS

This application is a U.S. national stage of international Application No. PCT/KR2019/007321 filed on Jun. 18, 2019, and claims priority to and the benefit of Korean Patent Application No. 10-2018-0075361 filed with the Korean Intellectual Property Office on Jun. 29, 2018, the entire contents of which are incorporated herein by reference.

TECHNICAL FIELD

The present invention relates to a plasma etching method using a Faraday cage.

BACKGROUND

Recently, as interest in a display unit for implementing augmented reality (AR), mixed reality (MR), or virtual reality (VR) has increased, such a display unit has been actively researched. The display unit for implementing augmented reality, mixed reality, or virtual reality includes a diffraction grating light guide plate that uses diffraction based on wave characteristics of light. The diffraction grating light guide plate includes diffraction grating patterns that may internally reflect or totally and internally reflect incident light to guide the light entering the diffraction grating light guide plate to one point.

Various methods are used to manufacture the diffraction grating light guide plate. In general, the diffraction grating light guide plate is manufactured by an imprinting method using a mold. In this case, the mold for a diffraction grating light guide plate may be manufactured by performing plasma etching on an etching base to form a diffraction grating pattern. However, there is a problem in that it is difficult to precisely form a desired pattern because a needle-like structure (grass) is formed in a pattern portion section of the etching base during the process of manufacturing the mold for a diffraction grating light guide plate by performing plasma etching.

Accordingly, there is need for a technology capable of forming a more precise pattern by inhibiting a needle-like structure from being formed during a plasma etching process.

SUMMARY

The present invention has been made in an effort to provide a plasma etching method using a Faraday cage which is capable of effectively inhibiting the formation of a needle-like structure.

An exemplary embodiment of the present invention provides a plasma etching method using a Faraday cage, the plasma etching method including: providing an etching base in a Faraday cage having a mesh part provided on an upper side thereof; shielding at least a part of the mesh part with a shutter and then performing plasma etching on the etching base; and forming a pattern portion on the etching base by performing the plasma etching while moving the shutter in a direction from an outer portion to a central portion of the Faraday cage, in which a depth of the pattern portion is gradually changed in a direction from one side to the other side of the etching base.

The plasma etching method using a Faraday cage according to an exemplary embodiment of the present invention may inhibit the formation of the needle-like structure and easily form the pattern portion having a depth gradient on the etching base.

The effects of the present invention are not limited to the above-mentioned effects, and other effects, which are not mentioned above, may be clearly understood by those skilled in the art from the present specification and the accompanying drawings.

BRIEF DESCRIPTION OF DRAWINGS

FIG. 1 is a graph representing the measured etching rate with respect to a distance from a mesh part of a Faraday cage to an etching base.

FIG. 2 is a schematic illustration of a plasma etching method using a Faraday cage according to an exemplary embodiment of the present invention.

FIG. 3 is a schematic illustration of an inclined plasma etching method using a Faraday cage according to an exemplary embodiment of the present invention.

FIG. 4A is an illustration of an initial position of a shutter in a plasma etching method using a Faraday cage according to Example 1 of the present invention.

FIG. 4B is an illustration of an initial position of a shutter in a plasma etching method using a Faraday cage according to Comparative Example 1.

FIG. 5A is a graph representing a change in depth of a pattern portion with respect to a distance from one side of a quartz base provided with a pattern portion and manufactured according to Example 1 of the present invention.

FIG. 5B is a graph representing a change in depth of a pattern portion with respect to a distance from one side of a quartz base provided with a pattern portion and manufactured according to Comparative Example 1.

FIG. 6A are Scanning Electron Microscopy (SEM) images of a cross section of the quartz base provided with the pattern portion and manufactured according to Example 1 of the present invention.

FIG. 6B are SEM images of a cross section of the quartz base provided with the pattern portion and manufactured according to Comparative Example 1.

DETAILED DESCRIPTION

Throughout the specification of the present application, unless explicitly described to the contrary, the word "comprise/include" and variations such as "comprises/includes" or "comprising/including" will be understood to imply the further inclusion of stated elements, not the exclusion of any other elements.

Throughout the specification of the present application, when one member is disposed "on" another member, this includes not only a case where the one member is brought into contact with another member, but also a case where still another member is present between the two members.

Throughout the specification, the term "step" or "step of" does not mean "step for".

In the present invention, a Faraday cage means a sealed space made of a conductor. When the Faraday cage is installed in plasma, a sheath is formed on an outer surface of the Faraday cage, such that a constant electric field is maintained in the Faraday cage. In this case, when an upper surface of the Faraday cage is formed as a mesh part, the sheath is formed along a surface of the mesh part. Therefore, in a case in which plasma etching is performed by using the Faraday cage, ions, which accelerate in a direction perpendicular to the sheath formed in parallel with the surface of the mesh part, enter the Faraday cage and then reach a base while maintaining directionality set when the ions enter the Faraday cage, thereby etching the base. Further, in the present invention, a surface of the molding base in the Faraday cage may be fixed to be parallel or inclined with respect to the surface of the mesh part, and the ions enter in the direction perpendicular to the surface of the mesh part, such that the etching may be performed in the direction perpendicular or inclined with respect to the surface of the molding base. The Faraday cage may be an electrically conductive cage including the mesh part having a conductive upper surface. An etching direction of the plasma etching may be perpendicular to the surface of the mesh part of the Faraday cage.

In the case of the plasma etching using the Faraday cage, the ions having passed through the mesh part lose their kinetic energy by colliding with neutral particles existing in the Faraday cage while moving toward the base, and as a result, density of the ions tend to be inversely proportional to a distance from the mesh part. That is, an etching speed becomes faster as the distance from the mesh part where the ions enter decreases, and the etching speed becomes slower as the distance from the mesh part increases.

The present inventors have developed the following invention by studying a plasma etching method using a Faraday cage having the above-mentioned characteristics and specifically studying a method capable of effectively inhibiting the formation of a needle-like structure during a plasma etching process.

Hereinafter, the present specification will be described in more detail.

An exemplary embodiment of the present invention provides a plasma etching method using a Faraday cage, the plasma etching method including: providing an etching base in a Faraday cage having a mesh part provided on an upper side thereof; shielding at least a part of the mesh part with a shutter and then performing plasma etching on the etching base; and forming a pattern portion on the etching base by performing the plasma etching while moving the shutter in a direction from an outer portion to a central portion of the Faraday cage, in which a depth of the pattern portion is gradually changed in a direction from one side to the other side of the etching base.

The plasma etching method using a Faraday cage according to an exemplary embodiment of the present invention may inhibit the formation of the needle-like structure and easily form the pattern portion having a depth gradient on the etching base.

According to an exemplary embodiment of the present invention, the etching base may be a quartz substrate or a silicon wafer. During the etching process using plasma etching, particularly, an induced coupled plasma reactive ion etching (ICP-RIE) device, there may occur a problem in that a needle-like structure (grass) having low reflectance is formed in an etching region by a self-masking mechanism. However, according to an exemplary embodiment of the present invention, since the quartz substrate or the silicon wafer is used as the etching base, it is possible to effectively inhibit the formation of a needle-like structure during the process of forming the pattern portion on one surface of the etching base by etching the etching base.

According to an exemplary embodiment of the present invention, a metal mask including at least one of aluminum and chromium and having an opening may be provided on one surface of the etching base. Specifically, the metal mask may be made of aluminum. The etching base having the metal mask provided on one surface thereof may be positioned in the Faraday cage. The plasma etching is performed in a region of the etching base exposed through the opening of the metal mask, such that the pattern portion may be formed on the etching base.

In addition, the metal mask may be provided with two or more openings. That is, two types of pattern portions may be formed on the etching base by using a metal mask having two or more openings.

According to an exemplary embodiment of the present invention, one surface of the etching base is plasma-etched by using the Faraday cage having the mesh part provided at the upper side thereof, thereby forming the pattern portion on one surface of the etching base. During the plasma etching, the mesh part may form a sheath by attracting free electrons from a contact surface with plasma. In addition, the mesh part may have conductivity and thus attract and accelerate positively-charged ions. Further, the mesh part may be provided flat on one surface of the Faraday cage. If the mesh part has a curved portion, an etching speed may locally vary at the curved portion.

According to an exemplary embodiment of the present invention, the mesh part may have a sheet resistance of 0.5 $\Omega$/square or more. Specifically, the sheet resistance of the mesh part may be 0.5 $\Omega$/square or more and 100 $\Omega$/square or less. In a case in which the etching base is plasma-etched by using the Faraday cage in the related art, there is a problem in that plasma etching accuracy deteriorates because a high etching region and a low etching region are irregularly mixed for each position of the Faraday cage. In contrast, according to an exemplary embodiment of the present invention, the high etching region and the low etching region may be constantly formed in the Faraday cage during the plasma etching by adjusting the sheet resistance of the mesh part to the above-mentioned range. That is, the etching base may be precisely etched to form the pattern portion. In addition, when the sheet resistance of the mesh part is within the above-mentioned range, manufacturing costs for the Faraday cage may be reduced and etching efficiency may be improved.

According to an exemplary embodiment of the present invention, the mesh part may be made by adsorbing a fluorocarbon radical to a metal mesh. Specifically, the fluorocarbon radical may be —CF, —CF$_2$, —CF$_3$, or —C$_2$F$_x$ (x is an integer of 1 to 5). More specifically, in the case of the mesh part of the Faraday cage, the fluorocarbon radical may be adsorbed to the mesh part by etching by an F radical and surface polymerization during the plasma etching. In addition, the mesh part may have a sheet resistance within the above-mentioned range as the fluorocarbon radical is adsorbed to a substance such as metal having conductivity.

According to an exemplary embodiment of the present invention, the mesh part may use a mesh made of a stainless material. Specifically, a commercially available #200 mesh made of an SUS304 material (having a pitch of 125 µm, a wire diameter of 50 µm, and an aperture ratio of 36%) may be used. However, the material of the mesh part is not limited, and the mesh part may be made of Al, Cu, W, Ni, Fe, or an alloy including at least two thereof. In addition, porosity and grating size of the mesh may be freely adjusted for the purpose of etching.

According to an exemplary embodiment of the present invention, a spacing distance between the etching base and the mesh part may be 1 mm or more and 35 mm or less. Specifically, the spacing distance between the etching base and the mesh part may be 3 mm or more and 32 mm or less, 6 mm or more and 30 mm or less, 8.5 mm or more and 25 mm or less, 10 mm or more and 15 mm or less, 8 mm or more and 12 mm or less, or 12.5 mm or more and 20 mm or less.

The present inventors installed a support having an inclined surface with an angle of 40° in the Faraday cage, provided the etching base on the support, and then performed plasma etching by using an ICP-RIE device (Oxford Plasmalab System 100). In this case, the reactive gas made by mixing $O_2$ and $C_4F_8$ at a ratio of 2:48 was supplied at a flow velocity of 50 sccm. In addition, the etching was performed for 3 minutes under an etching condition in which RF power was 150 W, ICP power was 2 kW, and operating pressure was 7 to 10 mTorr. In this way, an etching rate with respect to the distance from the mesh part of the Faraday cage was measured, and FIG. 1 illustrates the measurement result.

FIG. 1 is a graph representing a measure of the etching rate with respect to the distance from the mesh part of the Faraday cage to the etching base. It can be ascertained from FIG. 1 that the etching speed markedly decreases when the spacing distance between the etching base and the mesh part is greater than 35 mm. Therefore, the spacing distance between the etching base and the mesh part may be adjusted to 35 mm or less in consideration of etching efficiency. In addition, it was found that there was a problem in that a mesh grating pattern of the mesh part acted like an etching mask and remained in an etched region when the distance between the mesh part and the etching base is smaller than about 1 mm. Therefore, the spacing distance of at least 1 mm needs to be maintained between the etching base and the mesh part.

FIG. 2 is a schematic illustration of a plasma etching method using a Faraday cage according to an exemplary embodiment of the present invention. Specifically, as illustrated in FIG. 2, a support 300 is provided in a Faraday cage 100 having a mesh part 110 provided at an upper side thereof, an etching base 200 is positioned on the support 300, at least a part of the mesh part 110 is shielded by a shutter 120, and plasma etching is performed on the etching base 200. As further illustrated in FIG. 2, a pattern portion having a depth gradient is formed by performing plasma etching on the etching base 200 while moving the shutter 120 in a direction from an outer portion to a central portion of the Faraday cage 100 (in a direction of the dotted arrow).

According to an exemplary embodiment of the present invention, the plasma etching method using a Faraday cage may further include performing plasma etching on the etching base without shielding the mesh part with the shutter. For example, when the etching base is provided in the Faraday cage, the plasma etching may be performed to etch the etching base without shielding the mesh part with the shutter. Thereafter, the etching base may be plasma-etched while at least a part of the mesh part is shielded by the shutter, and then the etching base may be plasma-etched while the shutter moves in a direction from the outer portion to the central portion of the Faraday cage.

According to an exemplary embodiment of the present invention, at least a part of the mesh part is shielded by the shutter, and then the plasma etching may be performed on the etching base. In this case, the shutter may be provided on the mesh part, adjacent to the outer portion of the Faraday cage. As illustrated in FIG. 2, the shutter 120 is provided on the mesh part 110, adjacent to the outer portion of the Faraday cage 100, at least a part of the mesh part 110 is shielded by the shutter 120, and then plasma etching may be performed on the etching base 200. In this case, a position of the shutter 120 may be set so that one side of the etching base 200 adjacent to the outer portion of the Faraday cage 100 is shielded.

In addition, the position of the shutter may be set so that the etching base is not shielded while at least a part of the mesh part is shielded. For example, the shutter may be provided on the mesh part, adjacent to the outer portion of the Faraday cage, and the shutter may be positioned such that one side of the etching base adjacent to the outer portion of the Faraday cage is not shielded.

According to an exemplary embodiment of the present invention, since a part of the mesh part of the Faraday cage is shielded by the shutter, a degree of change in etching rate in accordance with an increase in distance from the mesh part to the etching base may be adjusted to increase in an etching region adjacent to the region shielded by the shutter. That is, since the degree of change in etching rate is adjusted to increase by shielding a part of the mesh part with the shutter, it is possible to easily form a pattern portion having a depth gradient in one surface of the etching base.

According to an exemplary embodiment of the present invention, the pattern portion may be formed on the etching base by performing plasma etching while moving the shutter in a direction from the outer portion to the central portion of the Faraday cage. That is, the shutter positioned in the vicinity of the outer portion of the Faraday cage may be moved to a portion in the vicinity of the central portion of the Faraday cage. As illustrated in FIG. 2, plasma etching may be performed on one surface of the etching base 200 while moving the shutter 120 provided on the mesh part 110 in a direction from the outer portion to the central portion of the Faraday cage 100 (in the direction of the dotted arrow). In this way, it is possible to easily form the etching base having a pattern portion having a depth that gradually changes in a direction from one side to the other side. Specifically, as illustrated in FIG. 2, a depth of a pattern portion P provided on the etching base 200 may gradually increase in a direction from one side of the etching base 200 adjacent to the outer portion of the Faraday cage 100 to the other side of the etching base 200 adjacent to the central portion of the Faraday cage 100.

In addition, since the plasma etching is performed while moving the shutter in a direction from the outer portion to the central portion of the Faraday cage, it is possible to markedly inhibit the formation of a needle-like structure during the plasma etching process. Specifically, when plasma etching is performed while moving the shutter in a direction from the outer portion to the central portion of the Faraday cage, a region having a pattern portion with a smaller depth, that is, a smaller etching depth, may be etched first while shielded by the shutter. Thereafter, a region having a pattern portion with a larger depth, that is, a larger etching depth, may be subsequently etched as the shutter is moved. In this way, it is possible to effectively inhibit the formation of a needle-like structure during the initial process of the plasma etching.

According to an exemplary embodiment of the present invention, formation of the pattern portion may include forming, on one surface of the etching base, a pattern portion, which has a depth that gradually changes from one side to the other side of the etching base, while the shutter sequentially shields one surface of the etching base from one side to the other side by moving the shutter in a direction from the outer portion to the central portion of the Faraday cage.

According to an exemplary embodiment of the present invention, a speed at which the shutter moves in a direction from the outer portion to the central portion of the Faraday cage may be changed. Specifically, the shutter may move on the mesh part in a direction from the outer portion to the central portion of the Faraday cage, and a movement speed of the shutter may gradually decrease. For example, the shutter may move at an interval of 1.9 mm on the mesh part in a direction from the outer portion to the central portion of the Faraday cage, and the movement speed of the shutter may decrease as the number of times the shutter is moved increases. Because the movement speed of the shutter gradually decreases, it is possible to reduce the number of needle-like structures formed during the plasma etching process and to form a pattern portion having a clearer depth gradient on the etching base.

In addition, the shutter may move on the mesh part in a direction from the outer portion to the central portion of the Faraday cage, and the movement speed of the shutter may gradually increase.

According to an exemplary embodiment of the present invention, the movement speed of the shutter may be 1 mm/min or more and 500 mm/min or less. Specifically, the shutter may move at a speed of 1 mm/min or more and 500 mm/min or less. In addition, the shutter may move at a speed of 1 mm/min or more and 500 mm/min or less, and the movement speed of the shutter may change in a direction from the outer portion to the central portion of the Faraday cage. For example, an imaginary region may be set on the etching base in a longitudinal direction of the etching base, and the movement speed of the shutter may change depending on the imaginary region shielded by the shutter as the shutter moves.

According to an exemplary embodiment of the present invention, by adjusting the movement speed of the shutter to be within the above-mentioned range, it is possible to further inhibit the formation of a needle-like structure during the plasma etching process and to more easily form a pattern portion having a depth gradient on the etching base.

According to an exemplary embodiment of the present invention, the etching base may be inclined with respect to a bottom surface of the Faraday cage. Since the etching base is inclined with respect to the bottom surface of the Faraday cage, it is possible to form an inclined pattern portion having a depth gradient on the etching base.

FIG. 3 schematically illustrates an inclined plasma etching method using a Faraday cage according to an exemplary embodiment of the present invention. As illustrated in FIG. 3, the support 300 having an inclined surface is provided in the Faraday cage 100 having the mesh part 110 at the upper side thereof, the etching base 200 is positioned on the support 300, at least a part of the mesh part 110 is shielded by the shutter 120, and the inclined plasma etching is performed on the etching base 200. As further illustrated in FIG. 3, an inclined pattern portion P having a depth gradient is formed by performing the inclined plasma etching on the etching base 200 while moving the shutter 120 in a direction from the outer portion to the central portion of the Faraday cage 100 (the direction of the dotted arrow).

According to an exemplary embodiment of the present invention, an inclination angle of the support with respect to the bottom surface of the Faraday cage may be 0° or more and 60° or less, or 35° or more and 45° or less. The inclination angle of the pattern portion may be adjusted by adjusting the inclination angle of the support.

An average inclination angle of the pattern portion may be adjusted to 0° to 55°, or 30° to 40° by adjusting the inclination angle of the support to the above-mentioned range. For example, when the inclination angle of the support is adjusted to 35°, a minimum inclination angle of the pattern portion may be adjusted to 27°, a maximum inclination angle of the pattern portion may be adjusted to 36°, and an average inclination angle of the pattern portion may be adjusted to 33°. In addition, when the inclination angle of the support is adjusted to 40°, the minimum inclination angle of the pattern portion may be adjusted to 32°, the maximum inclination angle of the pattern portion may be adjusted to 40°, and the average inclination angle of the pattern portion may be adjusted to 36°.

According to an exemplary embodiment of the present invention, the plasma etching may include adjusting ICP power of a plasma etching device to 0.1 kW or more and 4 kW or less, and adjusting RF power to 10 W or more and 200 W or less. Specifically, the ICP power of the plasma etching device may be adjusted to 0.2 kW or more and 3.8 kW or less, 0.5 kW or more and 3.5 kW or less, 0.75 kW or more and 3.0 kW or less, 1.0 kW or more and 2.5 kW or less, or 1.5 kW or more and 2.0 kW or less. In addition, the RF power of the plasma etching device may be adjusted to 10 W or more and 200 W or less, 20 W or more and 180 W or less, 50 W or more and 150 W or less, or 70 W or more and 120 W or less.

By adjusting the ICP power and the RF power of the plasma etching device to the above-mentioned ranges, it is possible to inhibit the formation of a needle-like structure during the process of plasma-etching the etching base and to reduce a size of a needle-like structure that may form during the plasma-etching process.

According to an exemplary embodiment of the present invention, the plasma etching may include adjusting the operating pressure to 1 mTorr or more and 30 mTorr or less. Specifically, the operating pressure may be adjusted to 2 mTorr or more and 28 mTorr or less, 5 mTorr or more and 28 mTorr or less, 7 mTorr or more and 25 mTorr or less, 10 mTorr or more and 20 mTorr or less, or 12 mTorr or more and 18 mTorr or less.

According to an exemplary embodiment of the present invention, the plasma etching may include supplying a gas mixture including a reactive gas and an oxygen gas to the plasma etching device at a supply flow rate of 10 sccm or more and 200 sccm or less. Specifically, during the plasma etching process, the gas mixture may be supplied to the plasma etching device at a supply flow rate of 20 sccm or more and 180 sccm or less, 40 sccm or more and 150 sccm or less, or 60 sccm or more and 130 sccm or less, or more particularly, 15 sccm or more and 75 sccm or less, 25 sccm or more and 70 sccm or less, 30 sccm or more and 70 sccm or less, 40 sccm or more and 60 sccm or less, or 45 sccm or more and 55 sccm or less.

By adjusting the supply flow rate of the gas mixture including the reactive gas and the oxygen gas to the above-mentioned range, it is possible to further inhibit the formation a needle-like structure during a process of patterning the etching base.

According to an exemplary embodiment of the present invention, a general reactive gas used for plasma etching may be used as the reactive gas. For example, a gas such as $SF_6$, $CHF_3$, $C_4F_8$, $CF_4$, and $Cl_2$ may be used as the reactive gas.

According to an exemplary embodiment of the present invention, the gas mixture may be supplied to the plasma etching device during the plasma etching process, and an amount of the oxygen gas in an overall flow of the gas mixture may be 1% or more and 20% or less. Specifically, the ratio of the flow rate of the oxygen gas to the overall flow rate of the gas mixture may be 1% or more and 15% or less, 1% or more and 10% or less, or 1% or more and 5% or less. When the ratio of the flow rate of the oxygen gas to the flow rate of the gas mixture is within the above-mentioned range, it is possible to effectively reduce the number of needle-like structures formed on the etching base during the plasma etching process.

According to an exemplary embodiment of the present invention, a depth of a needle-like structure may be controlled to be 50 nm or less on the bottom surface of the pattern portion of the etching base. In addition, a diameter of a needle-like structure may be controlled to be 50 nm or less on the bottom surface of the pattern portion of the etching base.

During the plasma etching using a general Faraday cage, a needle-like structure having a depth greater than 50 nm and a diameter greater than 50 nm is formed on the pattern portion of the etching base, and as a result, patterning precision may deteriorate. In contrast, the etching method according to an exemplary embodiment of the present specification performs plasma etching while moving the shutter in a direction from the outer portion to the central portion of the Faraday cage. As a result, it is possible to prevent the formation of a needle-like structure during the plasma etching process or to limit the height and the diameter of a needle-like structure, if formed, to the above-mentioned ranges. Further, it is possible to more effectively inhibit the formation of the needle-like structure or to further reduce the height and the diameter of the needle-like structure by adjusting the movement speed of the shutter, the ICP power and the RF power of the plasma etching device, the flow rate of the gas mixture to be supplied to the plasma etching device, the operating pressure, and the like.

According to an exemplary embodiment of the present invention, the etching base provided with the pattern portion may be a mold base for a diffraction grating light guide plate. Specifically, the pattern portion formed on the etching base may be a pattern of a mold for a diffraction grating light guide plate.

An exemplary embodiment of the present invention provides a method of manufacturing a diffraction grating light guide plate, the method including: preparing a mold for a diffraction grating light guide plate, the mold having a pattern portion formed by a plasma etching method using a Faraday cage; applying a resin composition onto one surface of the mold for a diffraction grating light guide plate, the mold having the pattern portion; and curing the resin composition.

According to an exemplary embodiment of the present invention, a resin composition, which is generally used in the art, may be used as the resin composition without limitation. Furthermore, the resin composition may be applied using a coating method, such as spin coating, dip coating, or drop casting, generally used in the art. In addition, a curing method, which is generally used in the art, may be used, without limitation, as the method of curing the resin composition. As an example, a photocuring method may be used when a photocurable resin composition is used, and a heat-curing method may be used when a thermoset resin composition is used.

According to an exemplary embodiment of the present invention, the diffraction grating light guide plate may be used as a direct diffraction grating light guide plate. In addition, the diffraction grating light guide plate may be used as an intermediate mold, and a final product may be manufactured by a method of reproducing the diffraction grating light guide plate. Specifically, when the diffraction grating light guide plate is manufactured again by using the manufactured diffraction grating light guide plate as the intermediate mold, it is possible to obtain a diffraction grating light guide plate having a gradient that is opposite to the gradient of the grating pattern of the diffraction grating light guide plate used as the intermediate mold. Furthermore, when a diffraction grating light guide plate is manufactured after a mold for a diffraction grating light guide plate is manufactured by using the diffraction grating light guide plate as the intermediate mold, it is possible to implement a grating pattern in a direction identical to the direction of the initial diffraction grating light guide plate.

Hereinafter, the present invention will be described in detail with reference to Examples to specifically describe the present invention. However, the Examples according to the present invention may be modified in various different forms, and it is not interpreted that the scope of the present invention is limited to the following Examples. The Examples of the present specification are provided to more completely explain the present invention to those skilled in the art.

Example 1

A Faraday cage, which had a mesh part having sheet resistance of 0.5605 Ω/square and a bottom surface formed as a stainless (SUS304) plate, was prepared. Further, the Faraday cage was provided in an induced coupled plasma reactive ion etching (ICP-RIE) device (Oxford Plasmalab System 100).

An Al layer having a thickness of 50 nm was formed by vapor-depositing Al on a quartz base having a thickness of 2 mm. Thereafter, an etching base was prepared by coating the Al layer with a photoresist by spin-coating, developing the photoresist through UV curing by using a photomask having a pitch of 400 nm, selectively etching the Al layer, and then forming, on the quartz base, an Al metal mask having a pattern having a pitch of 400 nm and a width of 200 nm.

Thereafter, a support made of an Al material and having a height of 30 mm was provided in the Faraday cage, and the quartz base was positioned on the support. In this case, a minimum spacing distance between one surface of the quartz base and the mesh part was about 5 mm.

FIG. 4A illustrates an initial position of the shutter in the plasma etching method using a Faraday cage according to Example 1 of the present invention. As illustrated in FIG. 4A, the shutter 120 was provided, on the mesh part 110, adjacent to the outer portion of the Faraday cage 100, and a part of the mesh part 110 was shielded. In this case, the shutter 120 was set to not shield the etching base 200.

Further, the plasma etching was performed by using the ICP-RIE device (Oxford Plasmalab System 100), and a reactive gas made by mixing $O_2$ and $C_4F_8$ at a ratio of 2:48 was supplied at a flow velocity of 50 sccm. In addition, as an etching condition, RF power was set to 150 W, ICP power was set to 2 kW, and operating pressure was set to 7 mTorr.

Thereafter, the shutter was moved at an interval of 1.9 mm in a direction from the outer portion to the central portion of the Faraday cage (the direction of the dotted arrow indicated in FIG. 4A). The following Table 1 shows movement speeds of the shutter with respect to the number of times the shutter is moved.

TABLE 1

| Number of times of movement | 1 | 2 | 3 | 4 | 5 | 6 | 7 | 8 | 9 | 10 | 11 | 12 | 13 |
|---|---|---|---|---|---|---|---|---|---|---|---|---|---|
| Movement speed (mm/min) | 185.4 | 165.2 | 147.1 | 128.8 | 111.2 | 94.2 | 77.8 | 62.5 | 48.0 | 34.8 | 22.8 | 12.6 | 3.1 |

Comparative Example 1

A Faraday cage and an etching base were prepared by the same method as in Example 1.

FIG. 4B illustrates an initial position of a shutter in a plasma etching method using a Faraday cage according to Comparative Example 1. As illustrated in FIG. 4B, the shutter 120 was provided, on the mesh part 110, adjacent to the central portion of the Faraday cage 100, and a part of the mesh part 110 was shielded. In this case, the position of the shutter 120 was set such that the shutter 120 shielded the etching base 200.

Further, the plasma etching was performed by using the ICP-RIE device (Oxford Plasmalab System 100), and a reactive gas made by mixing $O_2$ and $C_4F_8$ at a ratio of 2:48 was supplied at a flow velocity of 50 sccm. In addition, as an etching condition, RF power was set to 150 W, ICP power was set to 2 kW, and operating pressure was set to 7 mTorr.

Thereafter, the shutter was moved at an interval of 1.9 mm in the direction from the central portion to the outer portion of the Faraday cage (the direction of the dotted arrow indicated in FIG. 4B). The following Table 2 shows a change in movement speed of the shutter with respect to the number of times the shutter is moved.

TABLE 2

| Number of times of movement | 1 | 2 | 3 | 4 | 5 | 6 | 7 | 8 | 9 | 10 | 11 | 12 | 13 |
|---|---|---|---|---|---|---|---|---|---|---|---|---|---|
| Movement speed (mm/min) | 5.4 | 22.0 | 40.0 | 60.8 | 84.0 | 109.3 | 136.2 | 164.9 | 194.6 | 225.4 | 257.4 | 289.1 | 324.4 |

FIG. 5A is a graph representing a change in depth of the pattern portion with respect to a distance from one side of the quartz base provided with the pattern portion and manufactured according to Example 1 of the present invention, and FIG. 5B is a graph representing a change in depth of the pattern portion with respect to a distance from one side of the quartz base provided with the pattern portion and manufactured according to Comparative Example 1. One side of each of the quartz bases illustrated in FIGS. 5A and 5B means one side of the quartz base adjacent to the outer portion of the Faraday cage illustrated in FIGS. 4A and 4B.

It was ascertained from the graph of FIG. 5A that the depth of the pattern portion formed on the quartz base gradually increases in a direction from one side to the other side of the quartz base. In contrast, it was ascertained from the graph of FIG. 5B that the depth of the pattern portion formed on the quartz base gradually decreases in a direction from one side to the other side of the quartz base. That is, it was ascertained that each of the pattern portions of the quartz bases manufactured according to Example 1 of the present invention and Comparative Example 1 had a depth gradient. However, the directions of the depth gradients of the pattern portions of the quartz bases manufactured according to Example 1 and Comparative Example 1 are opposite to each other.

The SEM images of FIG. 6A show a cross section of the quartz base provided with the pattern portion and manufactured according to Example 1 of the present invention. The SEM images of FIG. 6B show a cross section of the quartz base provided with the pattern portion and manufactured according to Comparative Example 1.

It was ascertained from the SEM images of FIG. 6A that the formation of the needle-like structure was inhibited in the vicinity of the pattern portion of the quartz base in the case of Example 1 in which the plasma etching was performed while moving the shutter in a direction from the outer portion to the central portion of the Faraday cage. In contrast, it was ascertained from the SEM images of FIG. 6B that many needle-like structures were formed in the vicinity of the pattern portion of the quartz base in the case of Comparative Example 1 in which the plasma etching was performed while moving the shutter in a direction from the central portion to the outer portion of the Faraday cage.

Therefore, it can be seen that the plasma etching method using a Faraday cage according to an exemplary embodiment of the present invention may easily form the pattern portion having the depth gradient on the etching base and effectively inhibit the formation of the needle-like structure.

LIST OF REFERENCE NUMERALS AND SYMBOLS USED HEREIN

100: Faraday cage
110: Mesh part
120: Shutter
200: Etching base
300: Support

The invention claimed is:
1. A plasma etching method using a Faraday cage, the plasma etching method comprising:
  providing an etching base in the Faraday cage, wherein the Faraday cage has a mesh part provided on an upper side of the Faraday cage;
  shielding at least a part of the mesh part with a shutter; and
  forming a pattern portion on the etching base by performing plasma etching on the etching base while moving the shutter laterally along a top surface of the mesh part in a direction from an outer portion of the Faraday cage toward a central portion of the Faraday cage to prepare a patterned etching base,
  wherein a depth of the pattern portion progressively changes in a direction from one side of the etching base to an opposite side of the etching base.

2. The plasma etching method of claim 1, wherein the shutter is moved at a speed that changes in the direction from the outer portion of the Faraday cage toward the central portion of the Faraday cage.

3. The plasma etching method of claim 1, wherein the shutter is moved at a speed of 1 mm/min or more and 500 mm/min or less.

4. The plasma etching method of claim 1, wherein a spacing distance between the etching base and the mesh part is 1 mm or more and 35 mm or less.

5. The plasma etching method of claim 1, wherein the plasma etching includes adjusting an ICP power of a plasma etching device to 0.1 kW or more and 4 kW or less and adjusting a RF power of the plasma etching device to 10 W or more and 200 W or less.

6. The plasma etching method of claim 1, wherein the plasma etching includes adjusting an operating pressure of a plasma etching device to 1 mTorr or more and 30 mTorr or less.

7. The plasma etching method of claim 1, wherein the plasma etching includes supplying a gas mixture including a reactive gas and an oxygen gas to a plasma etching device at a flow rate of 10 sccm or more and 200 sccm or less.

8. The plasma etching method of claim 7, wherein an amount of the oxygen gas in the gas mixture is 1% or more and 20% or less.

9. The plasma etching method of claim 1, wherein the mesh part has a sheet resistance of 0.5 $\Omega$/square or more.

10. The plasma etching method of claim 1, wherein the mesh part includes a metal mesh with a fluorocarbon radical adsorbed on the metal mesh.

11. The plasma etching method of claim 1, wherein a metal mask including at least one of aluminum and chromium and having an opening is provided on one surface of the etching base.

12. The plasma etching method of claim 1, wherein the etching base is inclined with respect to a bottom surface of the Faraday cage.

13. The plasma etching method of claim 1, wherein the patterned etching base is a mold base for a diffraction grating light guide plate.

* * * * *